(12) United States Patent
Dal Toso et al.

(10) Patent No.: US 11,196,429 B2
(45) Date of Patent: Dec. 7, 2021

(54) LOCKING TECHNIQUE FOR PHASE-LOCKED LOOP

(71) Applicant: NXP USA, Inc., Austin, TX (US)

(72) Inventors: Stefano Dal Toso, Antibes (FR); Mathieu Perin, Cairon (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/939,251

(22) Filed: Jul. 27, 2020

(65) Prior Publication Data

US 2021/0067164 A1    Mar. 4, 2021

(30) Foreign Application Priority Data

Sep. 2, 2019 (EP) .................... 19306065

(51) Int. Cl.
*H03L 7/10*      (2006.01)
*H03L 7/081*     (2006.01)
*H03L 7/093*     (2006.01)
*H03L 7/099*     (2006.01)

(52) U.S. Cl.
CPC ............... *H03L 7/10* (2013.01); *H03L 7/081* (2013.01); *H03L 7/093* (2013.01); *H03L 7/099* (2013.01)

(58) Field of Classification Search
CPC .......... H03D 7/14; H03D 7/1458; G06F 1/08; H03L 7/10
See application file for complete search history.

(56) References Cited

U.S. PATENT DOCUMENTS

| | | |
|---|---|---|
| 5,132,642 A | 7/1992 | Bush et al. |
| 6,906,565 B2 | 6/2005 | Keaveney |
| 8,174,332 B1 * | 5/2012 | Lombaard ............. H03L 7/0893 331/185 |
| 2001/0016476 A1 | 8/2001 | Kasahara et al. |
| 2007/0285132 A1 | 12/2007 | Oh |
| 2008/0036513 A1 | 2/2008 | Koyama et al. |
| 2008/0278243 A1 | 11/2008 | Wang et al. |
| 2009/0085622 A1 | 4/2009 | Shen et al. |

\* cited by examiner

*Primary Examiner* — Hai L Nguyen

(57) ABSTRACT

Locking time for a phase-locked loop is decreased by selectively controlling a division value of the feedback divider during the first division cycle to reduce the initial phase error. The division value of the feedback divider during the first division cycle is selectively set such that the locking phase relationship between the two phase detector input signals is achieved at the end of the first division cycle.

17 Claims, 14 Drawing Sheets

LOCKING TECHNIQUE FOR PHASE-LOCKED LOOP

CROSS-REFERENCE TO RELATED APPLICATIONS

This application claims the priority under 35 U.S.C. § 119 of European Patent application no. 19306065.4, filed on 2 Sep. 2019, the contents of which are incorporated by reference herein.

FIELD

The present disclosure relates in general to phase-locked loops, and in particular, to systems and methods for reducing the locking time required to achieve a stable output signal in a phase-locked loop.

BACKGROUND

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

In general, a phase-locked loop circuit ("PLL") is a negative feedback system where an oscillator-generated signal is phase and frequency locked to a reference signal. PLLs are used in most communication systems. For example, a PLL may be implemented as a frequency synthesizer to generate an output signal with a frequency that is a programmable rational multiple of an input frequency (e.g., multiplying a 100 MHz reference clock signal to produce a 10 GHz signal). Other PLL applications are for frequency modulation and demodulation (e.g., as implemented in wireless communication systems, or for spread-spectrum clocking), for clock recovery (e.g., extracting from an incoming data stream the clock frequency and optimum phase of high-speed sampling clocks), and for skew cancellation (e.g., phase aligning an internal clock to an I/O clock).

There are many ways of implementing a PLL, but they generally can be represented by the block diagram of the PLL 100 illustrated in FIG. 1. The phase detector ("PD") 101 produces an output signal that is proportional to the phase difference between its two input signals: a reference signal (also referred to herein as the "REF signal") and a feedback signal (also referred to herein as the "FBK signal"). A low pass filter ("LPF") 102 may be included to reject a high frequency harmonic content of the output signal from the PD 101 and provide to the voltage controlled oscillator ("VCO") 103 a low frequency signal that controls the frequency of the output signal from the VCO 103 (identified in the figures as "OUT"). The feedback divider 104 generates the feedback signal FBK having a frequency that is N times smaller than the frequency of the output signal OUT from the VCO 103.

The output of the phase detector 101, once filtered by the LPF 102, drives the frequency of the output signal OUT from the VCO 103 in a direction that reduces the phase error between the REF and FBK signals. A locked state of the PLL 100 is reached when both the following conditions are simultaneously satisfied:

(1) the phase difference between the reference and feedback signals is equal to a target locking phase (denoted herein as "$\Delta\Phi_{LCK}$"); and (2) the average frequency of the feedback signal is equal to the frequency of the reference signal.

The number of integrators in the loop defines the type of the PLL. Since the oscillator behaves like an integrator (for the phase), the minimum PLL type is one (I). Higher PLL types are possible by adding an integrator in the LPF. However, the maximum PLL type is usually limited to two (II).

In a type-I PLL, the value of $\Delta\Phi_{LCK}$ depends on the particular type of phase detector implemented within the PLL, but nevertheless it will be greater than zero. Typical $\Delta\Phi_{LCK}$ values are 90 degrees (e.g., for an XOR gate-based phase detector or an analog multiplier such as a Gilbert cell) or 180 degrees (e.g., for a Set-Reset ("SR") latch-based phase detector).

For purposes of the present disclosure, the PLL phase error is defined as a difference between the reference signal (REF) and feedback signal (FBK) phase relationship and the locking phase relationship $\Delta\Phi_{LCK}$. For purposes of the present disclosure, the PLL frequency error is defined as the difference between the frequency of the reference signal (REF) and the frequency of the feedback signal (FBK). The PLL locking time (i.e., the time needed to reach the locked state) depends on the PLL bandwidth and on the initial PLL frequency and phase errors. The PLL bandwidth may not be chosen arbitrarily because it also impacts other aspect of the PLL, such as noise and spurs (spurious signals). Once the bandwidth has been chosen, the only parameters left for reducing the locking time are the initial frequency error and the initial phase error.

The initial frequency error is controlled by the VCO frequency calibration, and can be reduced as much as desired, depending on the calibration accuracy. As a result, also reducing the initial phase error would allow for a further reduction of the locking time.

DETAILED DESCRIPTION

Embodiments of the present disclosure provide systems and methods for reducing the initial phase error for PLLs in which the target locking phase is non-zero (i.e., $\Delta\Phi_{LCK}>0$). For type-II or larger PLLs, the problem of reducing the initial phase error is generally much easier to solve since $\Delta\Phi_{LCK}=0$.

Figure 1:
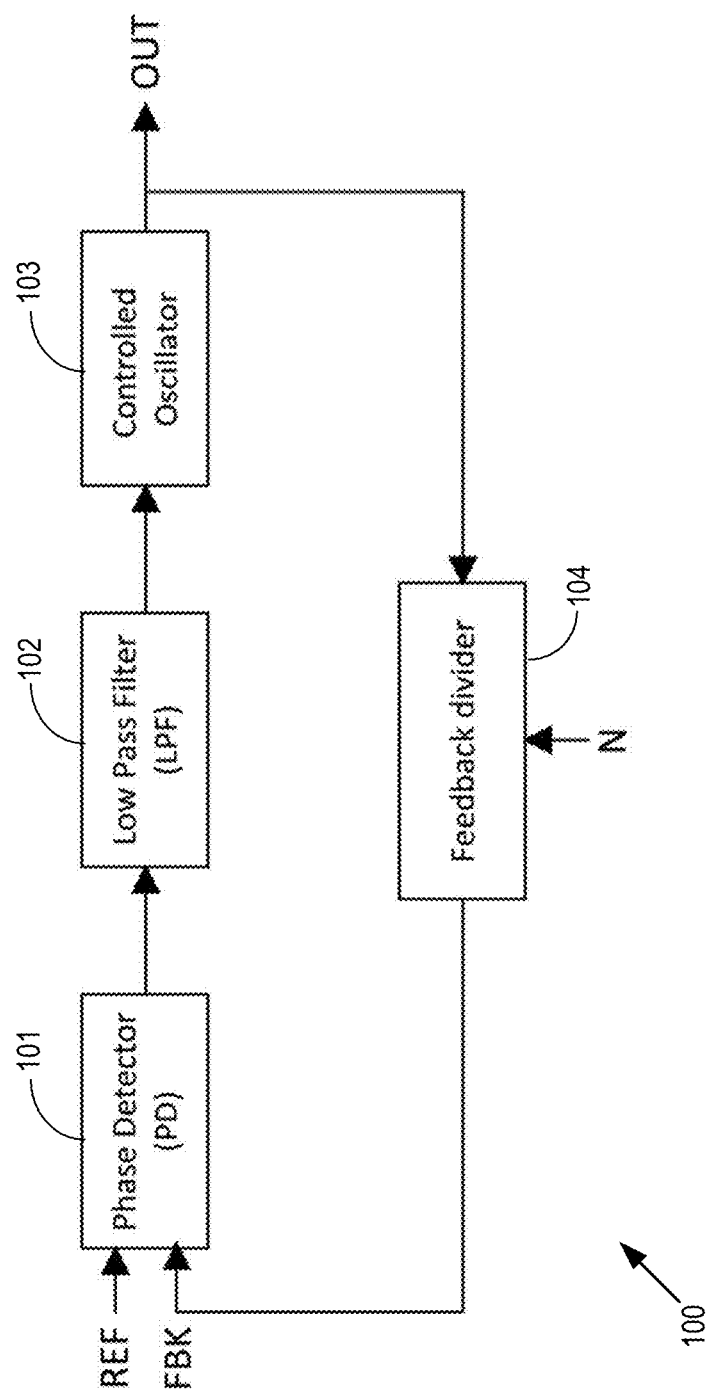
FIG. 1 illustrates a simplified block diagram of a phase-locked loop circuit ("PLL").
Figure 2:
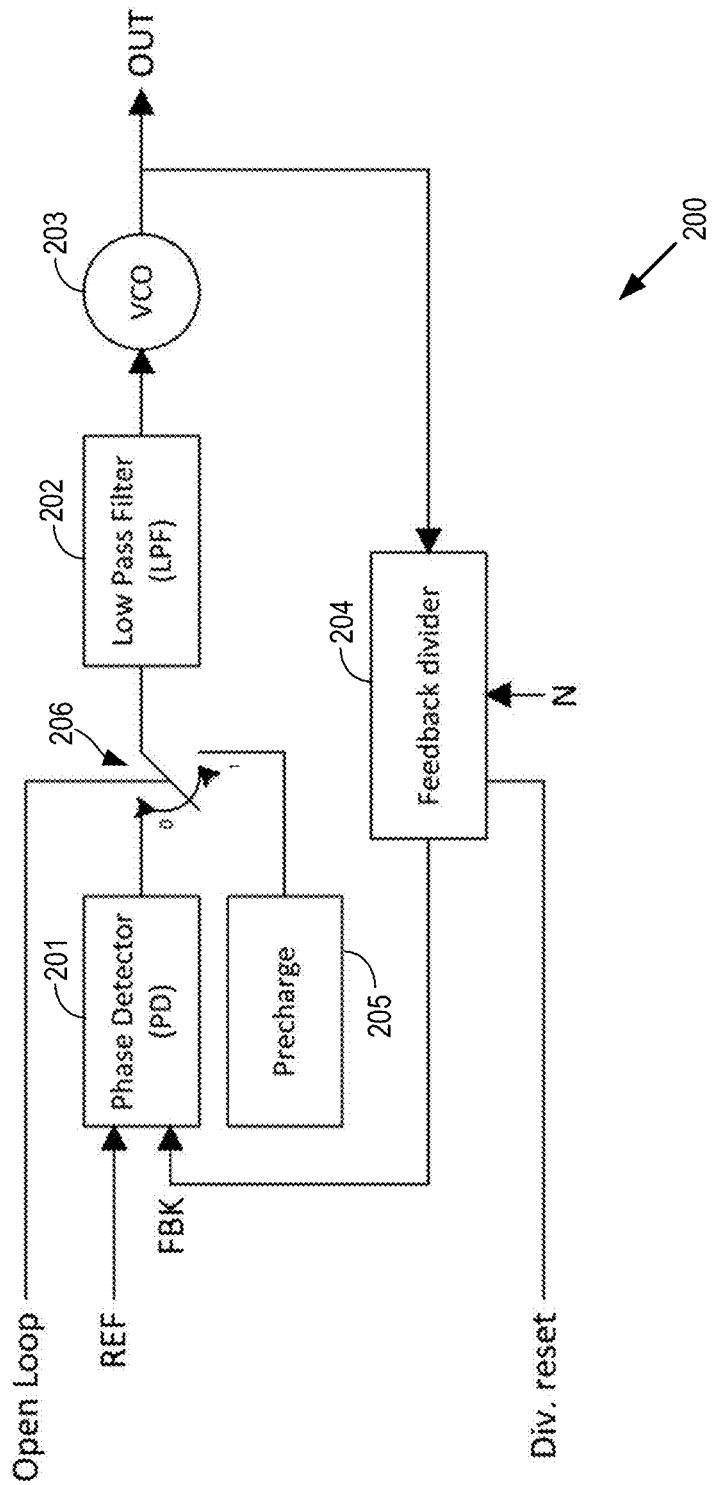
FIG. 2 illustrates a simplified block diagram of a type-I PLL.

FIG. 2 illustrates a simplified block diagram of a type-I PLL 200, with more implementation-oriented details compared to the block diagram of FIG. 1. An exemplary timing diagram for the PLL 200 is illustrated in FIG. 3, wherein the phase detector 201 is a SR latch-based phase detector (i.e., with $\Delta\Phi_{LCK}=180°$) active on the rising edge of the input signals (i.e., REF and FBK).

Figure 3:
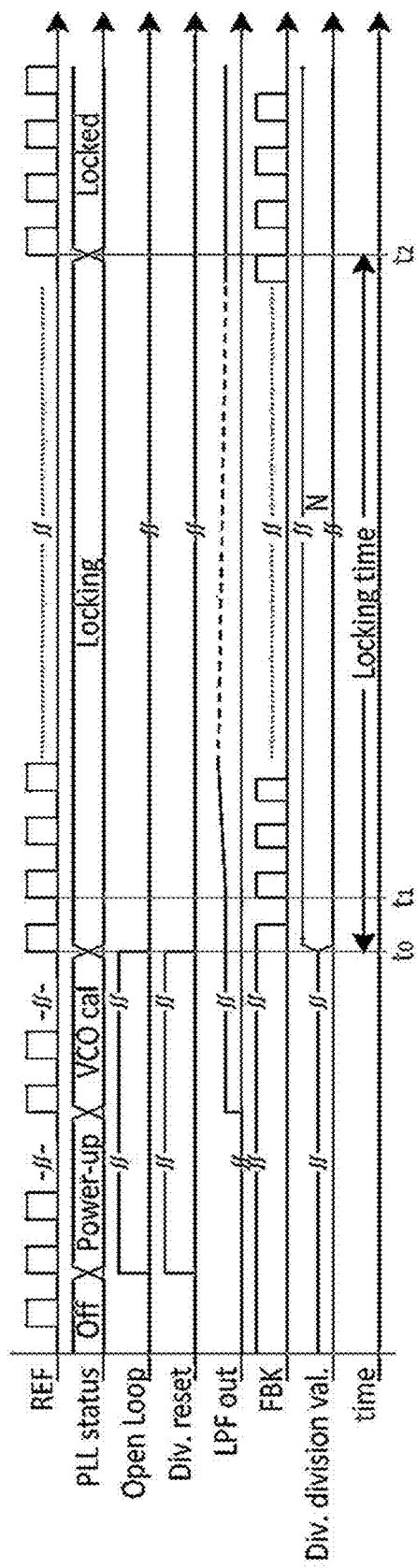
FIG. 3 illustrates a timing diagram for an exemplary operation of a type-I PLL with a SR latch-based phase detector.

Referring to the "PLL status" line in FIG. 3, an initial "Power-up" period is followed by a VCO frequency calibration period ("VCO cal"), to ensure that the free-running frequency of the VCO 203 is as close as possible to the desired frequency of the output signal OUT of the PLL 200. In this particular example illustrated in FIG. 3, it is assumed that the calibration is perfect, i.e., the free-running frequency of the VCO 203 is equal to the desired frequency of the output signal OUT of the PLL 200. During calibration ("VCO cal"), the tuning voltage input to the VCO 203 from the LPF 202 (labelled as "LPF out" in the figures) is maintained at a fixed voltage value as defined by a precharge circuit 205, which may be implemented in a well-known manner. The output of the precharge circuit 205 is fed to the input of the LPF 202 by an Open Loop switch 206 designated as open when the Open Loop signal in FIG. 3 is set to a high logic signal. To maximize the PLL acquisition range, the value of such a tuning voltage input ("LPF out") from the precharge circuit 205 may be set to a predetermined value (e.g., $V_{DD}/2$).

At the time instant $t_0$, the VCO calibration period ("VCO cal") ends, the Open Loop switch 206 is closed (the Open Loop signal in FIG. 3 transitions to a low logic signal), and the tuning voltage input ("LPF out") to the VCO 203 from the LPF 202 is now controlled by the output voltage produced by the PD 201. At the same time instant $t_0$, the reset signal (labelled as "Div. reset" in the figures) to the feedback divider 204 is disabled ("Div. reset" transitions to a low logic level), and the feedback divider 204 begins to divide by N (see the "Div. division val." line in FIG. 3) the output signal OUT from the VCO 203 to produce the FBK signal.

Since in this example the free-running frequency of the VCO 203 is identical to the desired target frequency for the output signal OUT, the division cycle of feedback divider 204 ends exactly after one period of the reference signal REF at the time instant $t_1$, and the REF and FBK signals now have the same phase. However, even though the initial frequency error was null (i.e., the free-running frequency of the VCO 203 is identical to the desired target frequency for the output signal OUT of the PLL 200), the PLL 200 does not immediately achieve the Locked condition (see the "PLL status" line in FIG. 3) because the initial phase difference between the REF and FBK signals is different from the locking one (i.e., the initial phase difference=360°, the locking phase difference=180°, and therefore, the initial phase error=180°).

In this condition, the duty cycle of the output signal of the phase detector 201 is equal or close to 1. As a result, the tuning voltage input to the VCO 203 from the LPF 202 ("LPF out") begins to increase, causing the frequency of the output signal OUT of the VCO 203 to increase. For the sake of simplicity, the "LPF out" signal illustrated in FIG. 3 (and in the following FIGS. 4-5, 7-8, and 10) is a simplified version of an actual signal output from a low pass filter in that it represents an average value of the signal (for example, without illustrating transients in the signal). Referring to the "PLL status" line in FIG. 3, after a Locking transient period (also indicated in FIG. 3 as the "Locking time"), the Locked condition is eventually reached at some later time instant $t_2$, where both the frequency of the output signal OUT from the VCO 203 and the phase relationship of the input signals REF and FBK to the phase detector 201 have reached their respective targeted values.

In this example (i.e., where the initial frequency error is null), if there was a method to force a zero initial phase error, the PLL 200 would have immediately achieved the Locked condition (e.g., the Locking time would have been zero). Therefore, it can be seen that cancelling (or reducing) the initial phase error would lead to a shorter (decreased) Locking time for the PLL 200 even in the case where the initial frequency error is larger than zero (not null). Consequently, all the other parameters being equal (i.e., PLL bandwidth and initial frequency error), the smaller the initial phase error, the shorter the Locking time for the PLL 200.

Taking into consideration the foregoing, embodiments of the present disclosure provide systems and methods for selectively controlling the feedback divider division value (N) during the first division cycle to reduce (or even cancel) the initial phase error for a PLL. Though not limited as such, embodiments of the present disclosure provide systems and methods for reducing the PLL locking time that applies for all type-I PLLs.

In accordance with embodiments of the present disclosure, the PLL is configured so that the division value (N) of the feedback divider is selected such that the first division cycle ends exactly when the phase of the reference signal is equal to the target locking phase $\Delta\Phi_{LCK}$. As a result, the required phase relationship between the reference and feedback signals is immediately achieved, resulting in a zero initial phase error.

In accordance with certain embodiments of the present disclosure, a PLL is configured so that the feedback divider triggers the reset input of the phase detector with a phase difference of $\Delta\Phi_{LCK}$ in comparison to the reference signal. In accordance with certain embodiments of the present disclosure, the division value (N) of the feedback divider during the first division cycle is set to a value of $N^*=N\cdot\Delta\Phi_{LCK}/360$, where N is the nominal division value of the feedback divider under normal operation (the nominal division value N is the ratio between the frequency of the output signal of the VCO and the frequency of the reference signal under normal operation of the PLL).

Figure 4:
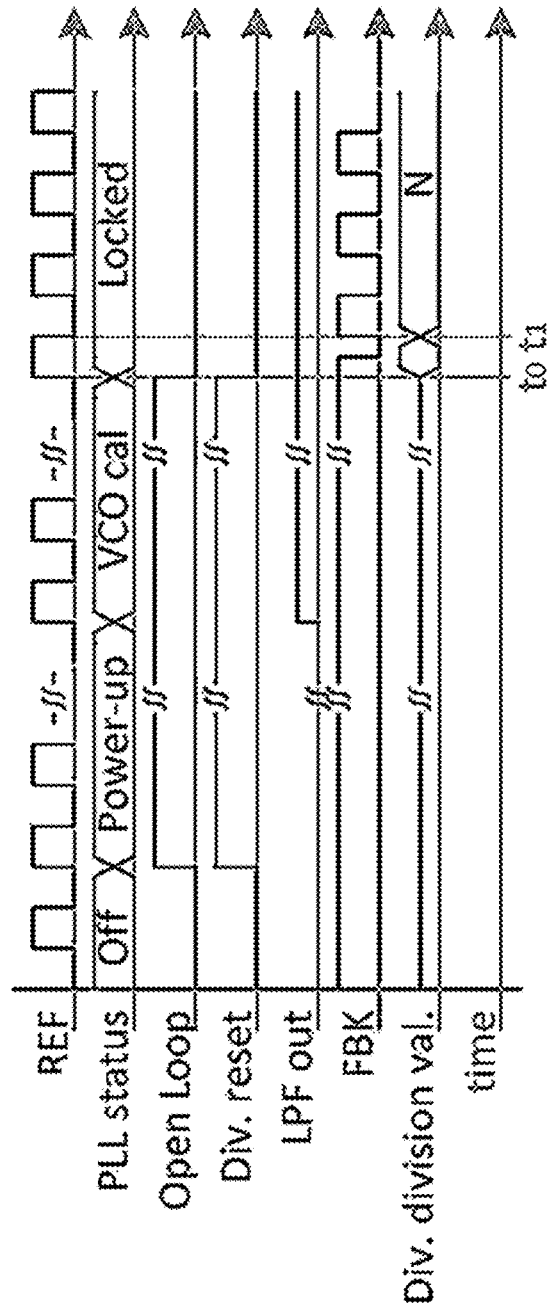
FIG. 4 illustrates a timing diagram of a type-I PLL with a SR latch-based phase detector in accordance with embodiments of the present disclosure.

Refer to the timing diagram illustrated in FIG. 4, which represents an exemplary operation of the PLL 200 (i.e., with a SR latch-based phase detector 201, and an ideal VCO frequency calibration) in which embodiments of the present disclosure have been implemented in the PLL 200. At the time instant $t_0$, the PLL 200 is configured to close the loop (i.e., the Open Loop switch 206 is closed whereby the Open Loop signal in FIG. 4 transitions to a low logic signal), and to activate the feedback divider 204 (i.e., the reset signal (identified as "Div. reset" in the figures) is disabled (i.e., set to a low logic signal)) so that the feedback divider 204 begins to divide the output signal OUT from the VCO 203. Differently from the example described with respect to FIG. 3, the first division value N of the feedback divider 204 is set to a value of $N^* = N \cdot \Delta\Phi_{LCK}/360$ (i.e., $N^* = N \cdot 180/360 = N/2$ due to the implementation of the SR latch-based phase detector 201). The PLL 200 is configured so that this first division cycle of the feedback divider 204 (illustrated in FIG. 4 as the time period of the "Div. divisional val." line from the time instant $t_0$ to the time instant $t_1$) ends at the time instant $t_1$ so that the phase of the REF signal is equal to $\Delta\Phi_{LCK} = 180°$, which results in the required phase relationship between REF and FBK being immediately achieved (e.g., the initial phase error is zero). As a result, the Locked condition (see the "PLL status" line) is immediately achieved.

The output of the phase detector 201 (which is input to the LPF 202) is a square wave having a 50% duty cycle during all of the division cycles. As a result, the tuning voltage input to the VCO 203 from the LPF 202 remains at a value of $V_{DD}/2$ (the same voltage as produced by the precharge circuit 205). The output frequency of the VCO 203 is proportional to the tuning voltage. Since the value of the tuning voltage remains the same as the one during the calibration phase, the output frequency of the VCO 203 also remains the same.

Figure 5:
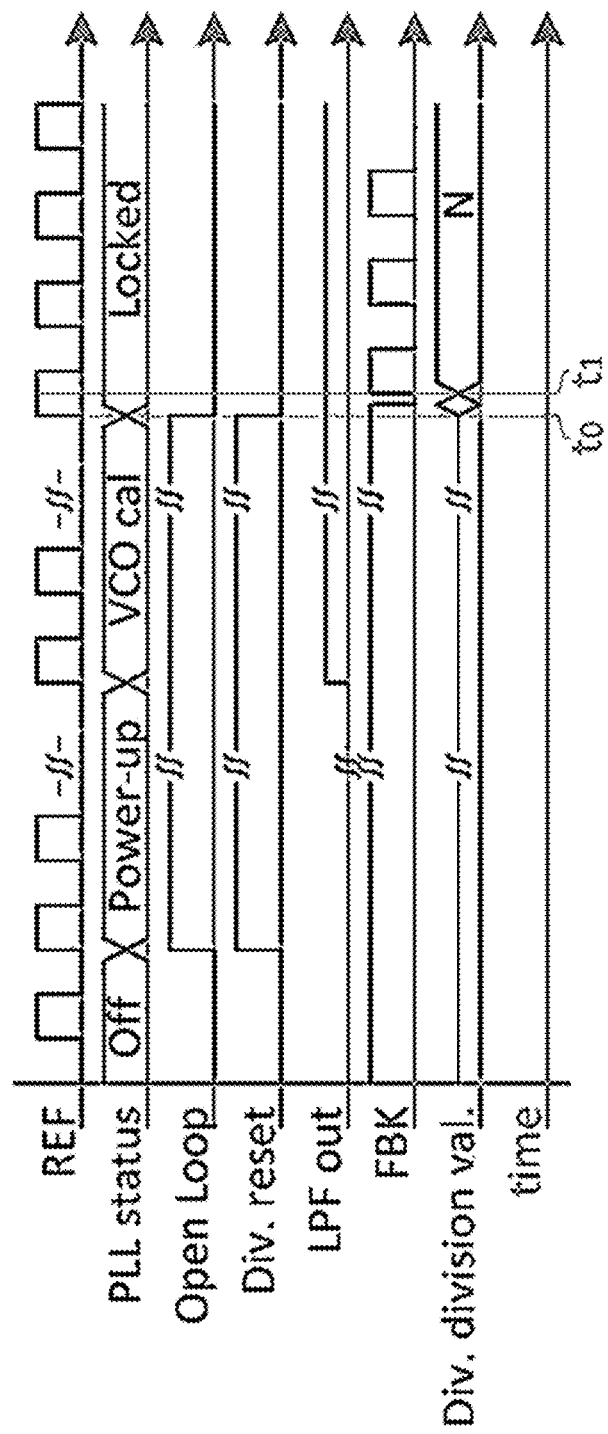
FIG. 5 illustrates a timing diagram of a type-I PLL with an XOR-based phase detector in accordance with embodiments of the present disclosure.

FIG. 5 illustrates a timing diagram for an exemplary operation of a PLL (e.g., the PLL 200) implemented with an XOR-based phase detector 201. In such an implementation, the locking phase difference between the REF and FBK signals is $\Delta\Phi_{LCK} = 90°$, and the PLL 200 is then configured in accordance with embodiments of the present disclosure to set the division value N for the feedback divider 204 during the first division cycle to a value of $N^* = N \cdot \Delta\Phi_{LCK}/360$ (i.e., $N^* = N \cdot 90/360 = N/4$).

As indicated by the "Div. division val" line in FIG. 5, the PLL 200 is configured so that the first division cycle begins at the time instant $t_0$ and ends at the time instant $t_1$ so that the phase of the REF signal is equal to $\Delta\Phi_{LCK} = 90°$, which results in the Locked condition being immediately achieved. Similar to the embodiments described with respect to FIG. 4, the output of the phase detector 201 is a square wave having a 50% duty cycle during all the division cycles. As a result, the tuning voltage input to the VCO 203 from the LPF 202 remains at a voltage value of $V_{DD}/2$ (the same voltage as produced by the precharge circuit 205), and any subsequent frequency drift happens compared to the VCO calibration period.

Note that in accordance with embodiments of the present disclosure, setting by the PLL of the first division value to a value of $N^* = N \cdot \Delta\Phi_{LCK}/360$ may not be sufficient to guarantee that the first division cycle ends exactly when the phase of the reference signal is equal to $\Delta\Phi_{LCK}$.

As a result, embodiments of the present disclosure may be configured so that the instant at which the feedback divider reset signal ("Div. reset") is disabled (e.g., the instant at which the feedback divider begins to divide the output signal OUT) is synchronous with the reference signal, and/or that the instant at which the loop is closed (e.g., closing of the Open Loop switch) is synchronous with the disabling of the feedback divider reset signal.

These conditions may be achieved by the PLL being configured to resynchronize the divider reset and/or Open Loop signals with the reference signal. However, in accordance with embodiments of the present disclosure, other techniques may be implemented by those skilled in the art to achieve similar results.

Figure 6:
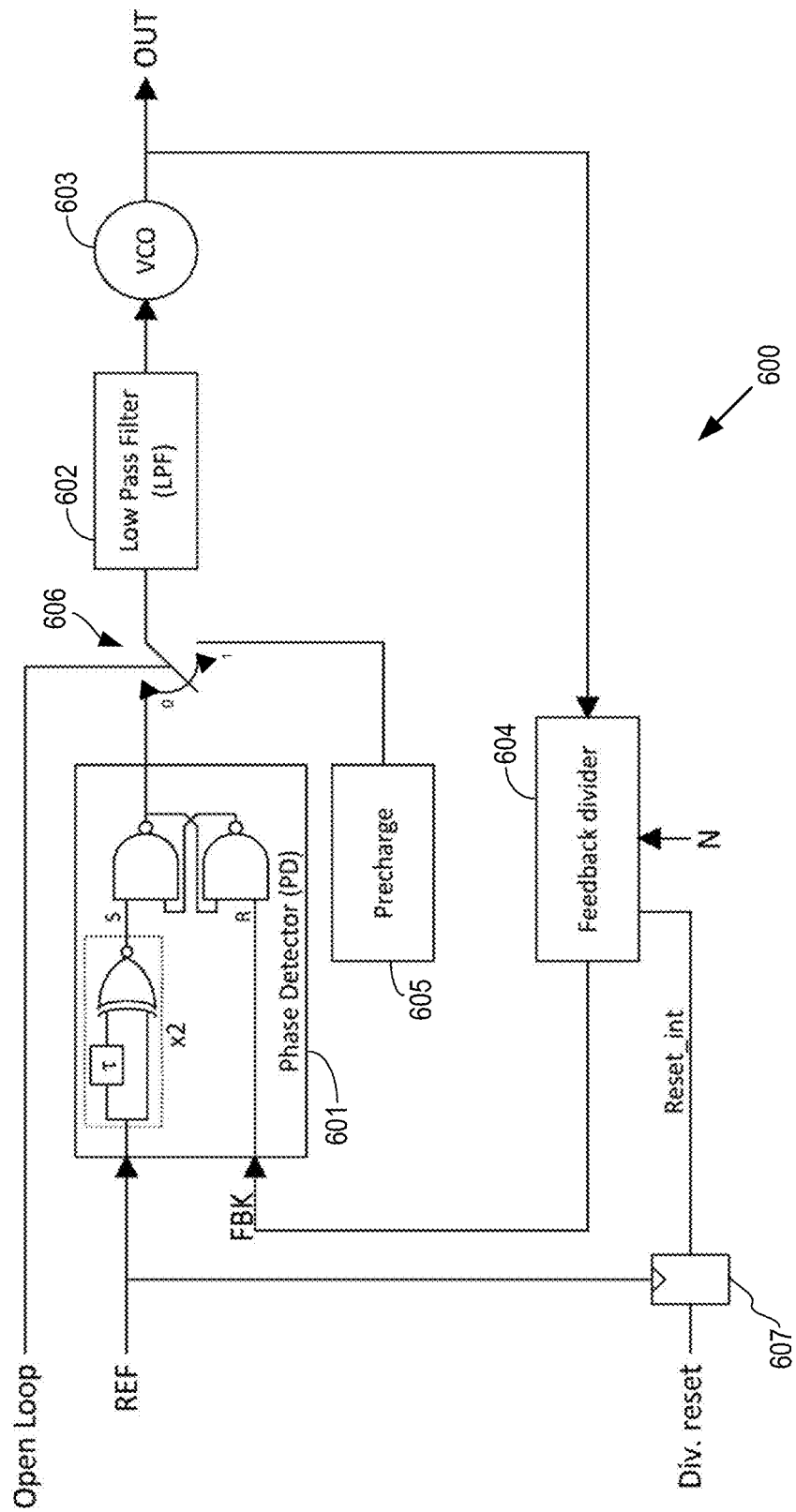
FIG. 6 illustrates an exemplary implementation of a type-I PLL in which a divider reset is synchronized with the reference signal.

FIG. 6 illustrates a block diagram of a PLL 600 configured to resynchronize the divider reset signal ("Div. reset") with the reference signal (e.g., by utilization of one or more latches). In this exemplary embodiment, the Open Loop signal is not resynchronized with the reference signal. As a result, the first of the two previously noted conditions is satisfied, while the second one is not.

Comparing the PLL 600 of FIG. 6 to the PLL 200 of FIG. 2, note that the REF signal is frequency multiplied by two before reaching the Set (S) input of the PD 601. Consequently, the "effective" reference signal is the multiplied-by-two REF signal to produce the Set (S) input of the PD 601. Nevertheless, embodiments of the present disclosure apply even in this embodiment, as well as in other embodiments where the reference signal is multiplied by any other value before reaching the input of the PD 601. Additionally, in this exemplary embodiment, the phase detector 601 is active on the low logic level of its input signal, rather than on the rising edge as previously described with respect to FIG. 2.

Figure 7:
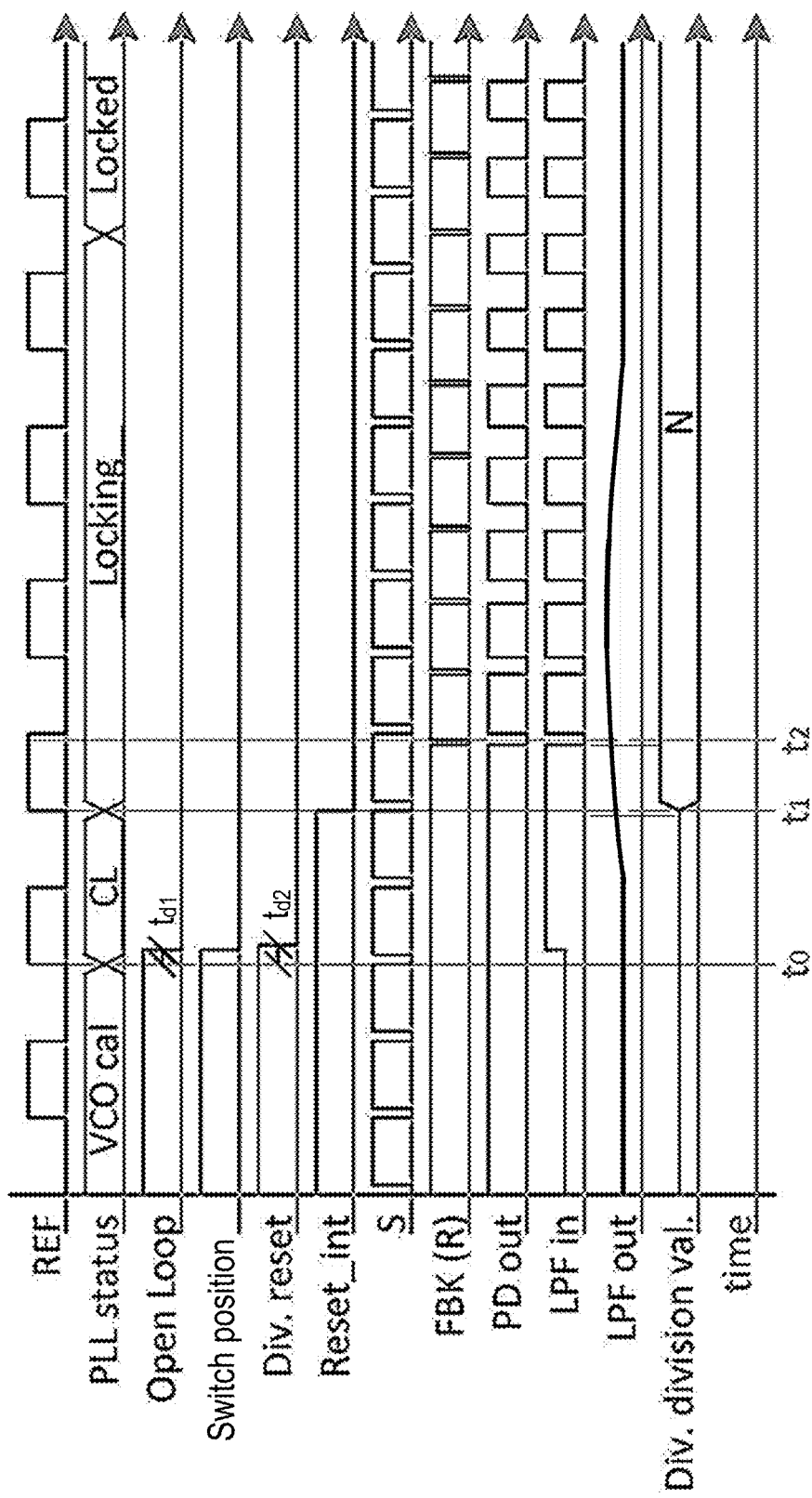
FIG. 7 illustrates a timing diagram for an exemplary operation of the type-I PLL of FIG. 6.

The associated timing diagram of an exemplary operation of the PLL 600 is illustrated in FIG. 7. At the time instant $t_0$, the VCO calibration ("VCO cal") ends, and the Open Loop and divider reset signals each transition to low logic levels. Note that in accordance with certain embodiments of the present disclosure, the Open Loop and divider reset signals may be generated inside digital circuitry that controls the PLL. Such digital circuitry may be implemented with a digital clock source that is different than the reference (REF) clock (e.g., a different frequency and/or different clock tree path). Consequently, the Open Loop and divider reset signals may not be synchronous with the REF signal. Even in an implementation in which the digital clock signal is synchronous with the REF signal, the Open Loop signal and the divider reset signal may not be synchronous with the REF signal because of a delay introduced by parasitic connections between the digital circuitry and the PLL. Therefore, in FIG. 7, $t_{d1}$ and $t_{d2}$ represent exemplary propagation times from the digital circuitry to the PLL 200 for the Open Loop and divider rest signals, respectively.

At the time instant $t_0 + t_{d1}$, the Open Loop switch 606 is closed ("Switch position" line in FIG. 7 transitions to a low logic level) resulting in the input of the LPF 602 being coupled to the output of the PD 601. However, the feedback divider 604 is still in a reset state because of the delay caused by a transitioning of the divider reset signal ("Div. reset") through the latch 607, which is cycled by the REF signal (correspondingly, the output signal (i.e., labelled as "FBK (R)" in FIG. 7) of the feedback divider 604 remains in a high logic level, since the feedback divider 604 has not yet commenced dividing the output signal OUT). The output of the PD 601 (labelled as "PD out" in FIG. 7) remains at a high logic level until the feedback divider 604 completes its first division cycle (denoted in the "Div. division val." line by the time interval from the time instant $t_1$ to the time instant $t_2$). During this time interval, the output voltage ("LPF out") of the LPF 602 begins to increase, causing the VCO 603 to change its output frequency. At the time instant $t_1$ (one period of the REF signal after the time instant $t_0$) the feedback divider 604 commences to operate (i.e., divide the output signal OUT) as a result of the resynchronized feedback divider reset input ("Reset_int") to the feedback divider 604 transitioning to a low logic signal. At the end of this first division cycle of the feedback divider 604 (i.e., the time instant $t_2$), the phase of the Set (S) signal of the phase detector 601 is approximately 360° (but not exactly since the frequency of the output signal OUT of the VCO 603 has already begun to drift because of the increasing output voltage from the LPF 602). As a result, the initial phase error is approximately 360°–180°=180°. Therefore, a Locking transient (see the "PLL status" line) occurs to recover both the initial phase error and the VCO frequency error (caused by the drifting voltage of the LPF 602).

Figure 8:
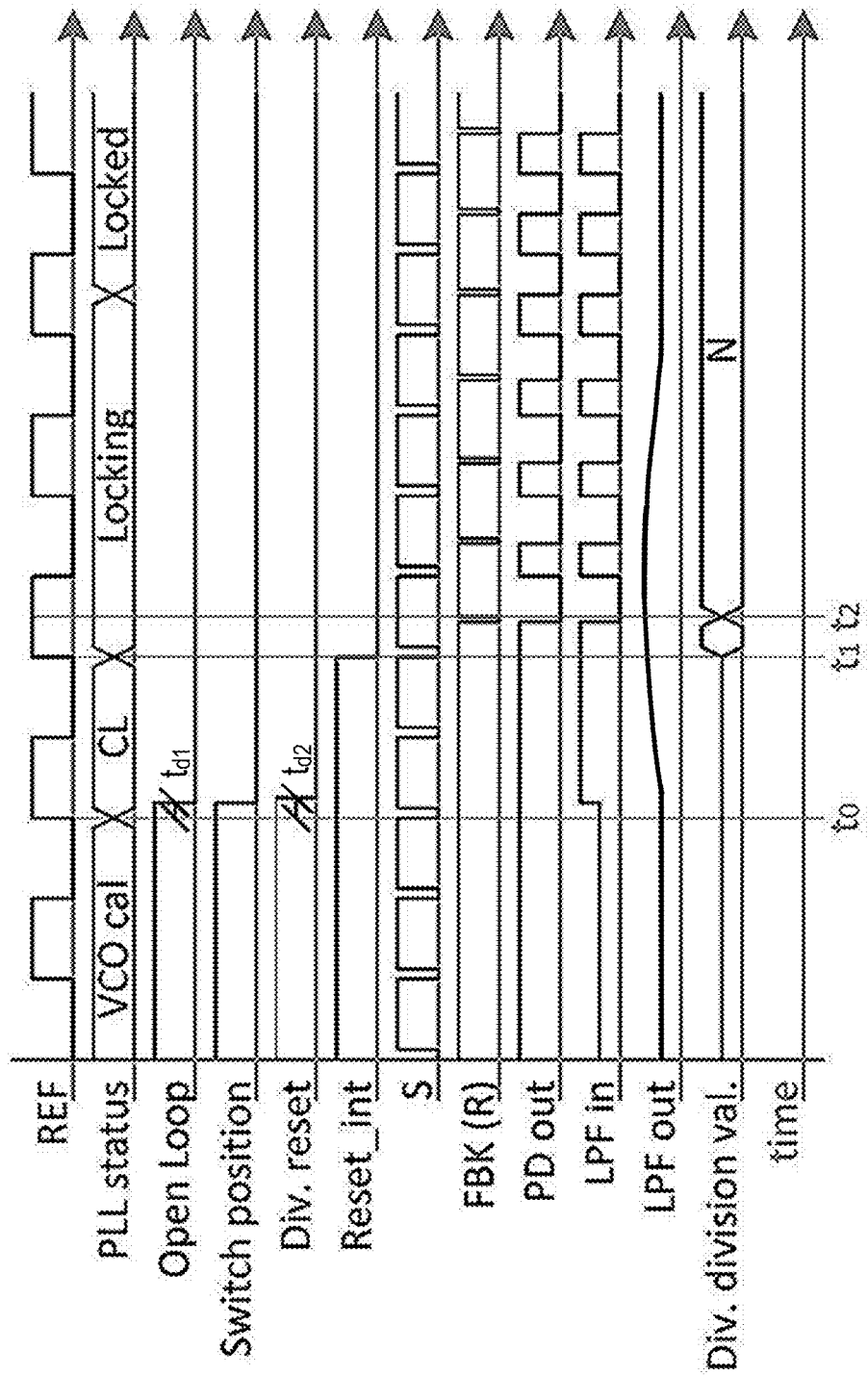
FIG. 8 illustrates a timing diagram for an exemplary operation of the type-I PLL of FIG. 6 in accordance with embodiments of the present disclosure.

FIG. 8 illustrates a timing diagram representing an implementation of embodiments of the present disclosure in which the Open Loop signal is not synchronized with the reference signal. Until the time instant $t_1$, timing of the various signals within the PLL 600 is the same as the exemplary embodiment described with respect to FIG. 7. However, at this time instant $t_1$, the PLL 600 is configured so that the division value N of the feedback divider 604 during the first division cycle (identified in FIG. 8 as the time period of the "Div. division val." line from the time instant $t_1$ to the time instant $t_2$) is set to a value of $N^*=N\cdot\Delta\Phi_{LCK}/360=N\cdot180/360=N/2$ (due to the PD 601 being implemented with a SR latch-based phase detector). At the end of this first division cycle (i.e., the time instant $t_2$), the phase of the Set (S) signal of the phase detector 601 may be approximately, but not exactly, 180°. As described with respect to FIG. 7, the output of the PD 601 remains at a high logic level from the time instant $t_0+t_{d1}$ until the time instant $t_2$ causing the output voltage ("LPF out") of the LPF 602 to increase. The initial phase error is approximately 0°, but a Locking transient (see the "PLL status" line) still occurs in order to compensate the frequency drift of the VCO 603 and cancel the phase error. Since the initial phase error is much smaller than in the case of FIG. 7, the corresponding Locking time is decreased.

Figure 9:
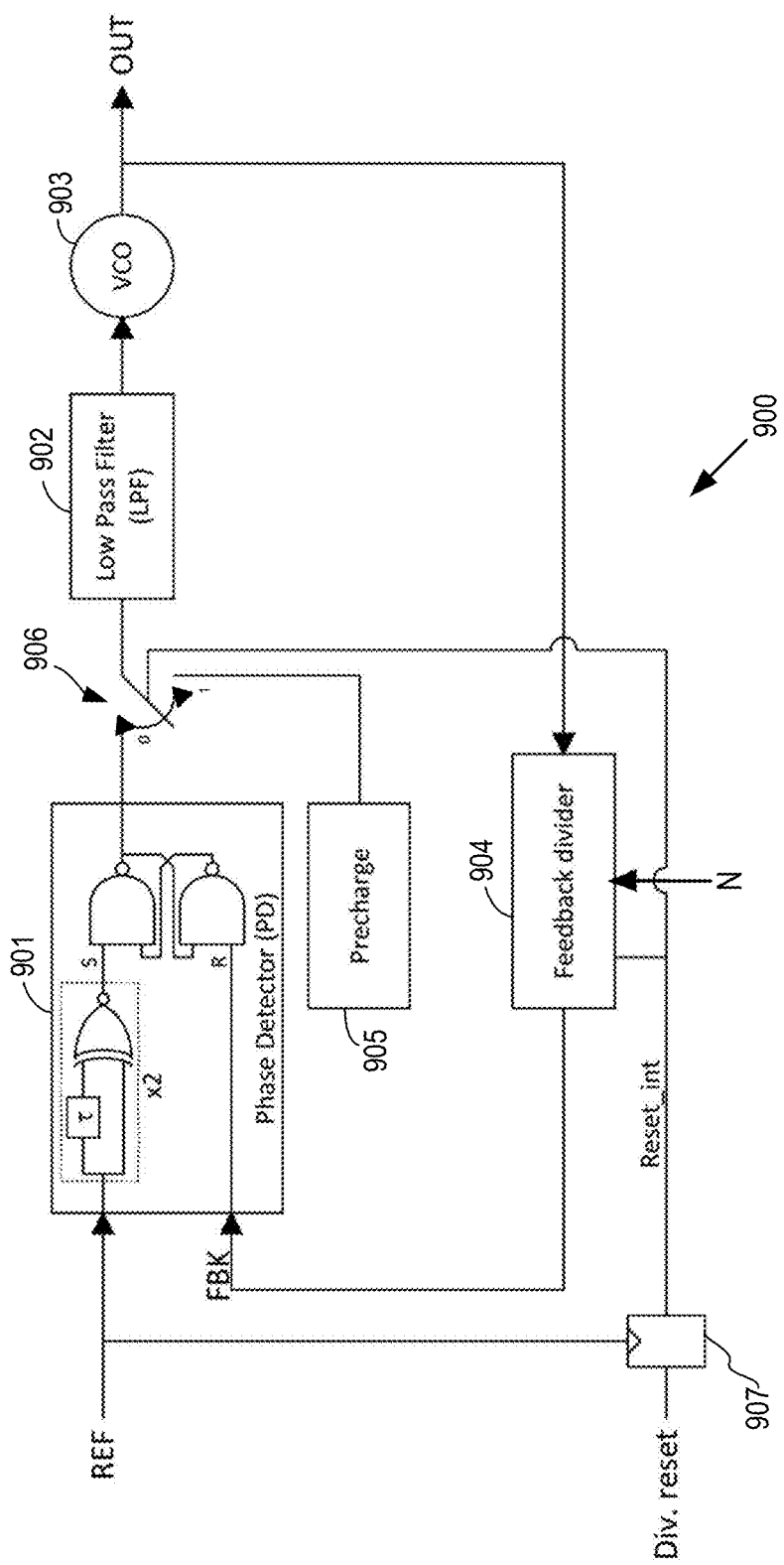
FIG. 9 illustrates an exemplary implementation of a type-I PLL in which a divider reset and open loop signal are synchronized with the reference signal.
Figure 10:
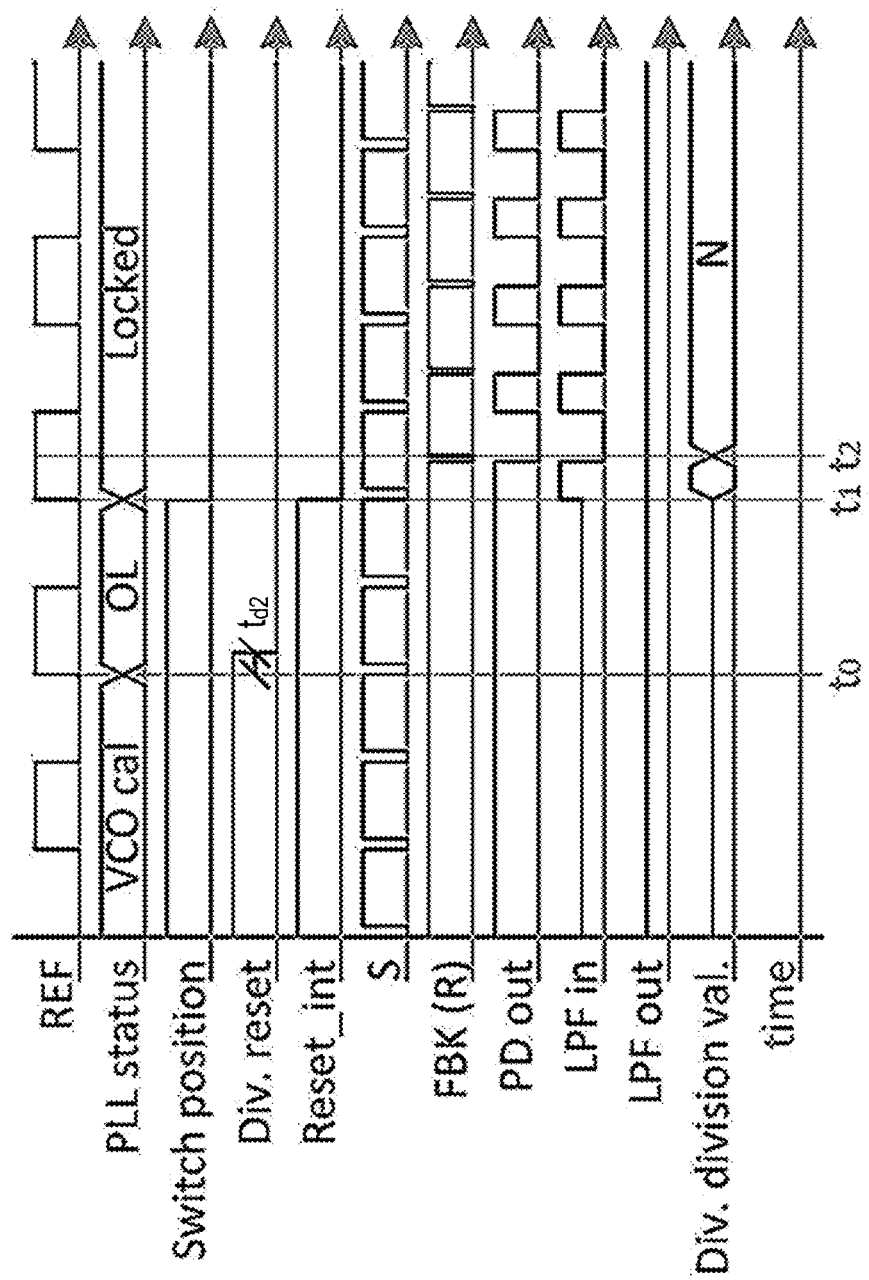
FIG. 10 illustrates a timing diagram for an exemplary operation of the type-I PLL of FIG. 9 in accordance with embodiments of the present disclosure.

FIG. 9 illustrates a PLL 900 configured in accordance with embodiments of the present disclosure in which both the feedback divider reset signal ("Div. reset") and the Open Loop signal are synchronized. The associated timing diagram is illustrated in FIG. 10. Except as described with respect to FIG. 10, the circuit elements 901-907 may be configured to operate in a similar manner as circuit elements 601-607 of FIG. 6.

In accordance with embodiments of the present disclosure, instead of synchronizing both of the feedback divider reset ("Div. reset") and Open Loop signals with the REF signal, the resynchronized feedback divider reset input (labelled as "Reset_int") is used to control both the feedback divider 904 and the Open Loop switch 906.

As illustrated in FIG. 10, the PLL 900 is configured to remain in an Open Loop state (labelled as "OL" in FIG. 10) until the time instant $t_1$ at which time the feedback divider 904 begins to divide the output signal OUT from the VCO 903. The PLL 900 is configured to set the division cycle value N for the feedback divider 904 to a value of $N^*=N\cdot180/360=N/2$ during the first division cycle (as indicated by the time interval from the time instant $t_1$ to the time instant $t_2$ in the "Div. division val." line in FIG. 10) of the feedback divider 904. At the time instant $t_2$, the phase of the Set (S) signal of the PD 901 is exactly 180°, and the Locked condition is thus immediately achieved.

Recall that FIGS. 3-5, 7-8, and 10 illustrate a simplified version of the LPF out signal. While the average value of the input signal to the LPF 902 ("LPF in") in FIG. 10 does not change, the output signal from the LPF 902 ("LPF out") may naturally react to the to the direct current ("DC")-to-square wave transition (see the "LPF in" line) at the time instant $t_1$ with a transient that depends on the impulse response of the particular topology of low pass filter implemented for the LPF 902.

Figure 11:
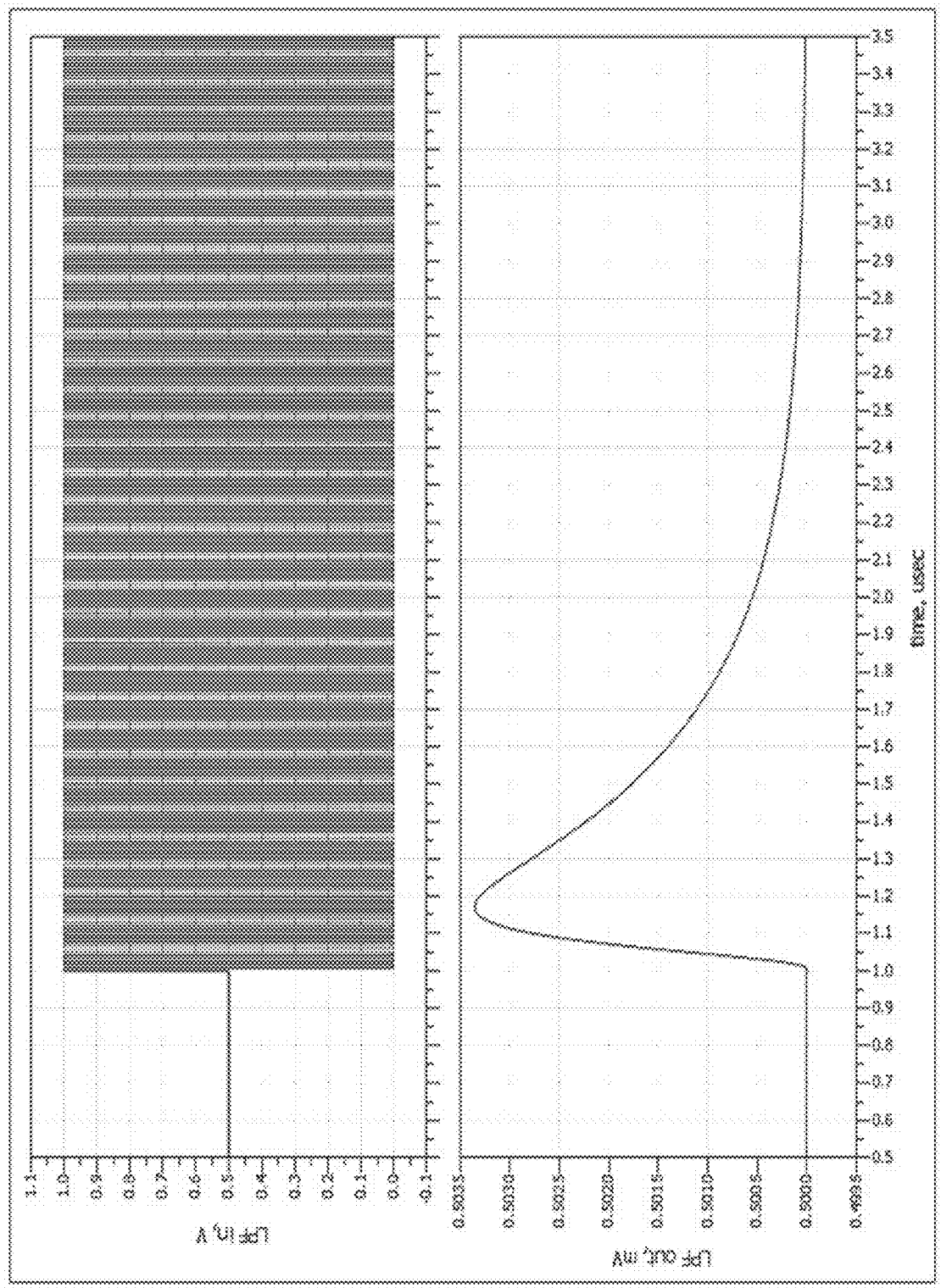
FIG. 11 illustrates a transient behavior of the input and output signals of an exemplary low pass filter without compensating for the impulse response of the low pass filter.

FIG. 11 illustrates a transient behavior of the output signal ("LPF out") for an exemplary low pass filter topology (i.e., an exemplary LPF impulse response to the input signal "LPF in") for an exemplary low pass filter that may be implemented within a phase-locked loop (e.g., PLL 902), assuming that the loop is closed at the time instant $t_1=1$ µsec (e.g., the Open Loop switch 906 is closed so that the output of the phase detector 901 is coupled to the input of the LPF 902). Such a transient behavior may not be desired because it may cause a VCO frequency transient that needs to be recovered to achieve the Locked condition.

Note that in accordance with embodiments of the present disclosure, the impact of such a transient can be neglected. Nevertheless, certain embodiments of the present disclosure incorporate a solution to alleviate (e.g. suppress) such a transient by delaying the instant at which the loop is closed (i.e., the instant at which the low pass filter 902 receives the transition of the input signal "LPF in" from a DC signal to a square wave signal).

Figure 12:
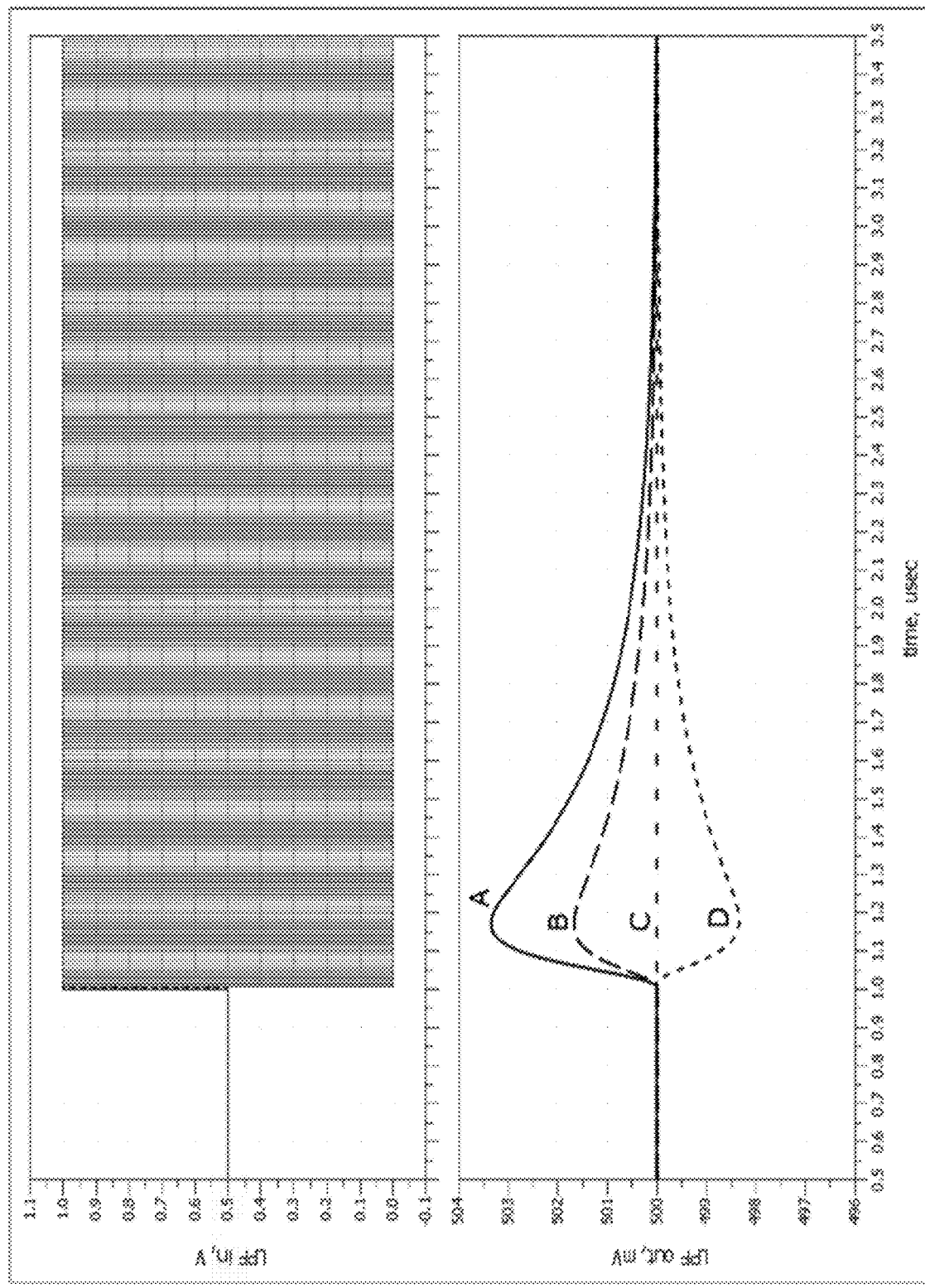
FIG. 12 illustrates the transient behavior of the input and output signals of an exemplary low pass filter for different exemplary delay values.

FIG. 12 illustrates the transient behavior of the output signal ("LPF out") for several different exemplary delay values. As can be seen, the LPF out signal has different responses at the time instant $t_1$ depending on the delay value implemented within the PLL. If the delay is properly chosen, a substantially flat response can be achieved (e.g., see line C). That means that the frequency of the output signal OUT from the VCO 903 remains the same before and after the time instant $t_1$ (since the VCO frequency is proportional to LPF out, if LPF out does not change, the VCO frequency does not change).

Figure 13:
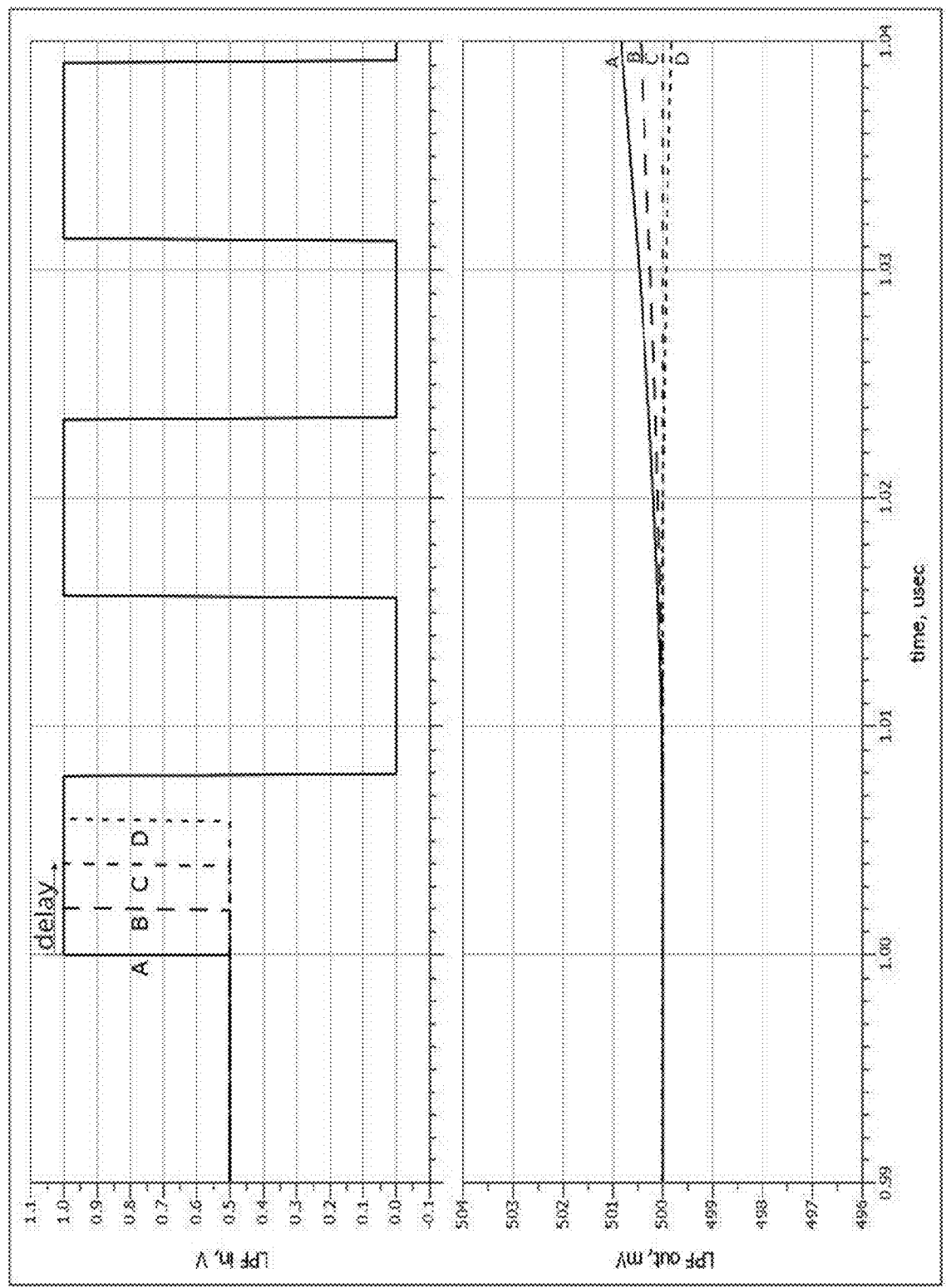
FIG. 13 illustrates a magnified portion of FIG. 12 around the time instant $t_1$ to demonstrate the impact of a delay implemented on the input signal to the low pass filter.

FIG. 13 illustrates a magnified portion of FIG. 12 around the time instant $t_1$ to demonstrate the impact of a delay implemented on the LPF in signal. A delay value that achieves a flat response depends on the actual LPF implementation, but in any case, may be between 0 and one-half of a period of the output signal from the Phase Detector.

Figure 14:
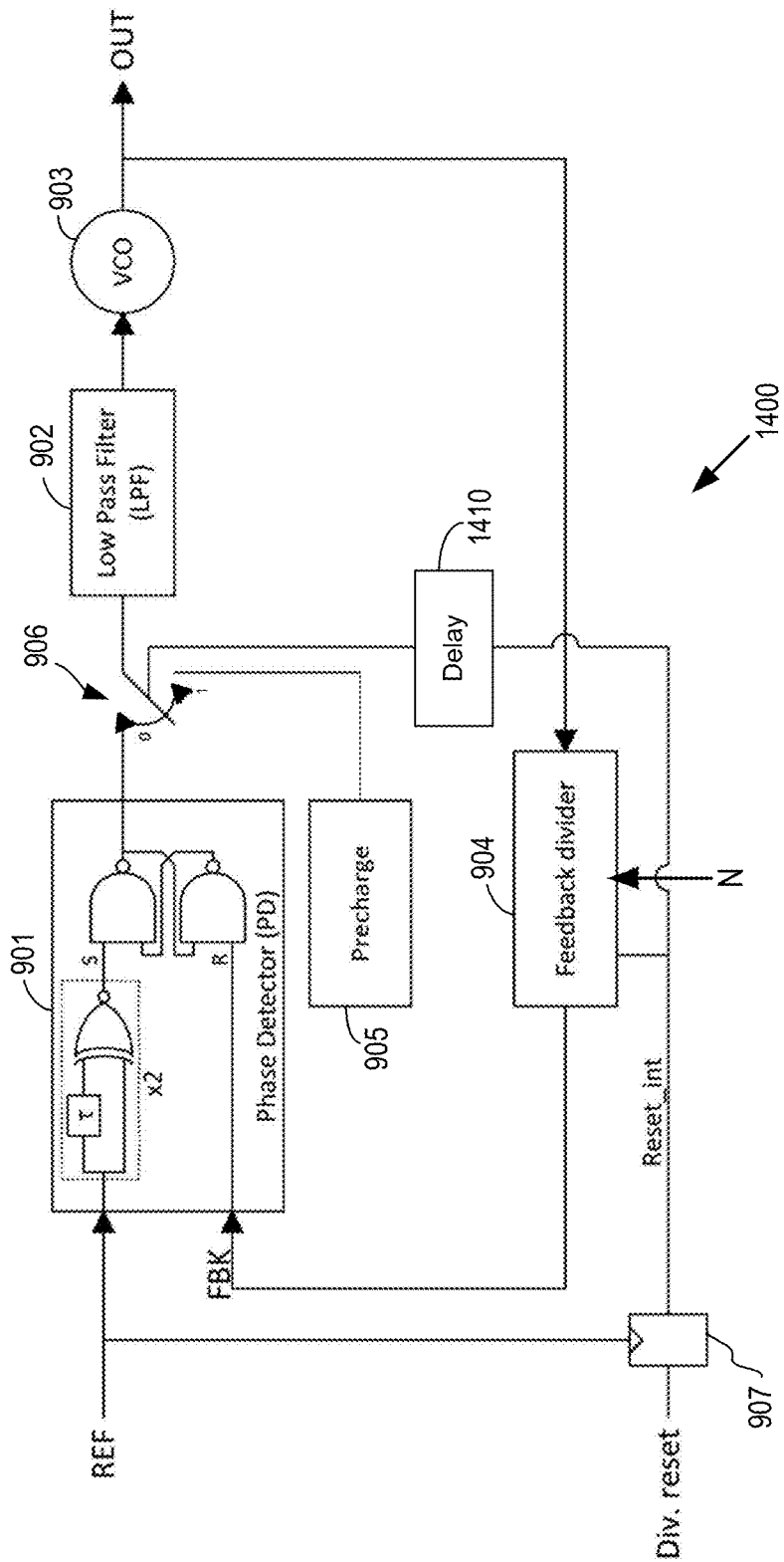
FIG. 14 illustrates an exemplary implementation of a PLL in which a delay is introduced into the Open Loop signal.

FIG. 14 illustrates a PLL 1400 configured in accordance with certain embodiments of the present disclosure. PLL 1400 is similar to PLL 900, except that a delay circuit 1410 is coupled between the latch 907 and the Open Loop switch 906, wherein the delay circuit 1410 is configured to introduce a delay on actuation of the Open Loop signal. The delay circuit 1410 may be implemented with any well-known circuitry for implementing a specified delay of the Reset_int signal to the Open Loop switch 906 in order to delay the closing of the Open Loop switch 906. The circuit elements 901-907 may be configured to operate in a similar manner as described with respect to FIG. 9.

Note that, in accordance with embodiments of the present disclosure, any of the phase-locked loop circuits described herein may be implemented with a SR latch-based phase detector, an XOR phase detector, or any other type of phase detector as long as the division value of the feedback divider during the first division cycle is appropriately set as described herein.

The phase-locked loop circuits described herein may be configured to set the various input parameters described in the exemplary timing diagrams (e.g., the value of the division value N, the Open Loop signal, and the divider reset signal) of FIGS. 4, 5, 8, and 10 by implementing circuitry and/or software code in a well-known manner. In a non-limiting example, circuitry and/or software code may be implemented within the feedback divider in a well-known manner so that these parameters are controlled and appropriately timed as described herein. Consequently, the timing diagrams described herein illustrate the architecture, functionality, and operation of possible implementations of systems, methods, and computer program products according to various embodiments of the present disclosure. In this regard, the relative timing of the various signals represented in the timing diagrams may represent one or more modules, segments, circuitry, or portions of instructions for implementing the specified logical functions illustrated in the timing diagrams. It will also be noted that the timing of the various signals in each of the timing diagrams can be implemented by special purpose hardware-based systems that perform the specified functions or acts or carry out combinations of special purpose hardware and software instructions implemented with respect to the various phase-locked loop circuits described herein.

Embodiments of the present disclosure may be implemented within any type of system that utilizes a type-I PLL, including, but not limited to, a controller circuit with wireless communication capabilities, such as for use in such exemplary applications as automotive car access, car sharing, passive entry/passive start ("PEPS") systems, sensors, tire pressure monitoring system ("TPMS"), wireless on-board diagnostic functions, asset tracking, building control and monitoring, building HVAC control, CAN to BLE bridge, data usage collection, fire/security, hospital infrastructure, and retail pricing management.

Embodiments of the present disclosure provide a type-I phase-locked loop ("PLL") including a phase detector receiving a reference signal and a feedback signal, a controlled oscillator having an input coupled to an output of the phase detector, and a feedback divider coupled to an output of the controlled oscillator, wherein the feedback divider outputs the feedback signal to the phase detector, wherein during a first division cycle of the feedback divider, a division value of the feedback divider is set such that a locking relationship is achieved between the reference signal and the feedback signal during the first division cycle. The division value of the feedback divider may be set to a ratio of a phase difference of the phase detector under a locked state and 360°. The division value of the feedback divider may be set to a nominal value after the first division cycle, wherein the division value during the first division cycle is different from the nominal value. The division value of the feedback divider may be set to the nominal value multiplied by a ratio of a phase difference of the phase detector under a locked state and 360°. The phase detector may be an XOR-based phase detector, wherein the division value during the first division cycle is set to one fourth of the nominal value. The phase detector may be a Set-Reset latch-based phase detector, wherein the division value during the first division cycle is set to one half of the nominal value. The Set input of the Set-Reset latched-based phase detector may be multiplied by a factor of 2. The reset input of the feedback divider may be synchronized with the reference signal, wherein the reset input signals the feedback divider to begin dividing the output of the controlled oscillator. The type-I PLL may further include an open loop switch coupled between the output of the phase detector and the input of the controlled oscillator, wherein operation of the open loop switch is synchronized with the divider reset signal. The type-I PLL may further include a low pass filter having an output coupled to the input of the controlled oscillator, and a delay circuit configured to delay the operation of the open loop switch so that a coupling of the output of the phase detector to an input of the low pass filter is delayed relative to the reset input.

Embodiments of the present disclosure provide a method for operating a phase-locked loop, the method including setting a division value of a feedback divider to a ratio of a phase difference of a phase detector under a locked state and 360° during a first division cycle of the feedback detector, and setting the division value of the feedback divider to a nominal value during a second division cycle of the feedback divider that is subsequent to the first division cycle, wherein the division value during the first division cycle is different than the nominal value. The division value during the first division cycle may be set to the nominal value multiplied by the ratio of the phase difference of the phase detector under the locked state and 360°. The phase detector may be an XOR-based phase detector, wherein the division value during the first division cycle is set to one fourth of the nominal value. The phase detector may be a Set-Reset latch-based phase detector, wherein the division value during the first division cycle is set to one half of the nominal value. The method may further include commencing the first division cycle in a synchronized relationship with a reference signal received by the phase detector. The method may further include synchronizing a coupling of an output of the phase detector to an input of a low pass filter with the beginning of the first division cycle. The method may further include delaying for a specified time period the coupling of the output of the phase detector to the input of the low pass filter relative to the commencement of the first division cycle.

Embodiments of the present disclosure provide a phase-locked loop including a phase detector receiving a reference signal and a feedback signal, a low pass filter, a voltage controlled oscillator having an input coupled to an output of the low pass filter, and a feedback divider coupled to an output of the voltage controlled oscillator, wherein the feedback divider outputs the feedback signal to the phase detector, wherein, during a first division cycle of the feedback divider, the feedback divider is configured to divide the output of the voltage controlled oscillator by a division value set to a predetermined nominal division value of the feedback divider multiplied by a ratio between a phase difference of the phase detector under a locked state of the phase-locked loop and 360°, and wherein the feedback divider is configured to divide the output of the voltage controlled oscillator by the predetermined nominal division value during a second division cycle subsequent to the first division cycle. The phase-locked loop may further include circuitry configured to synchronize a couple of an output of the phase detector to an input of the low pass filter with a commencement of the first division cycle. The phase-locked loop may be a type-I phase-locked loop.

Locking time for a phase-locked loop is decreased by selectively controlling a division value of the feedback divider during the first division cycle to reduce the initial phase error. The division value of the feedback divider during the first division cycle is selectively set such that the locking phase relationship between the two phase detector input signals is achieved at the end of the first division cycle.

While the exemplary embodiments disclosed herein are described in sufficient detail to enable those skilled in the art to practice embodiments of the present disclosure, it should be understood that other embodiments may be realized and that various changes to embodiments of the present disclosure may be made without departing from the spirit and scope of the present disclosure.

In this disclosure, singular forms "a," "an," and "the" include plural referents unless the context clearly dictates otherwise.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

The invention claimed is:

1. A type-I phase-locked loop ("PLL") comprising:
   a phase detector receiving a reference signal and a feedback signal;
   a controlled oscillator having an input coupled to an output of the phase detector; and
   a feedback divider coupled to an output of the controlled oscillator and coupled to receive a division value and a reset signal, wherein the feedback divider divides the output of the controlled oscillator using the division value to generate the feedback signal which is provided to the phase detector, wherein the feedback divider is configured to, in response to the reset signal being disabled, perform a first division cycle of the feedback divider, wherein, for the first division cycle, the division value of the feedback divider is set to a nominal value of the feedback divider multiplied by a ratio of a phase difference of the phase detector under a locked state and 360° in order to achieve a target locking phase between the reference signal and the feedback signal during the first division cycle.

2. The type-I PLL as recited in claim 1, wherein the division value of the feedback divider is set to a nominal value after the first division cycle, wherein the division value during the first division cycle is different from the nominal value.

3. The type-I PLL as recited in claim 2, wherein the phase detector is an XOR-based phase detector, and wherein the division value during the first division cycle is set to one fourth of the nominal value.

4. The type-I PLL as recited in claim 2, wherein the phase detector is a Set-Reset latch-based phase detector, and wherein the division value during the first division cycle is set to one half of the nominal value.

5. The type-I PLL as recited in claim 4, wherein a Set input of the Set-Reset latched-based phase detector is multiplied by a factor of 2.

6. The type-I PLL as recited in claim 4, wherein the reset input of the feedback divider is synchronized with the reference signal, wherein the reset input signals the feedback divider to begin dividing the output of the controlled oscillator.

7. The type-I PLL as recited in claim 6, further comprising an open loop switch coupled between the output of the phase detector and the input of the controlled oscillator, wherein operation of the open loop switch is synchronized with the divider reset signal.

8. The type-I PLL as recited in claim 7, further comprising:
   a low pass filter having an output coupled to the input of the controlled oscillator; and
   a delay circuit configured to delay the operation of the open loop switch so that a coupling of the output of the phase detector to an input of the low pass filter is delayed relative to the reset input.

9. A method for operating a phase-locked loop, in which the phase-locked loop includes a phase detector, a controlled oscillator coupled to the phase detector, and a feedback divider, the feedback divider configured to receive an oscillator output signal from the controlled oscillator, a reset signal, and a division value, the method comprising:
   in response to the reset signal being disabled, the feedback divider dividing the oscillator output signal by the division value during a first division cycle to generate a feedback signal to the phase detector, wherein the division value for the first division cycle is set to a nominal value of the feedback divider multiplied by the ratio of a phase difference of a phase detector under a locked state and 360°; and
   the feedback divider dividing the oscillator output signal by the division value during a second division cycle to generate the feedback signal to the phase detector, the second division cycle being subsequent to the first division cycle, wherein the division value for the second division cycle is set to the nominal value, wherein the division value during the first division cycle is different than the nominal value.

10. The method as recited in claim 9, wherein the phase detector is an XOR-based phase detector, and wherein the division value during the first division cycle is set to one fourth of the nominal value.

11. The method as recited in claim 9, wherein the phase detector is a Set-Reset latch-based phase detector, and wherein the division value during the first division cycle is set to one half of the nominal value.

12. The method as recited in claim 9, further comprising commencing the first division cycle in a synchronized relationship with a reference signal received by the phase detector.

13. The method as recited in claim 12, further comprising synchronizing a coupling of an output of the phase detector to an input of a low pass filter with the beginning of the first division cycle.

14. The method as recited in claim 13, further comprising delaying for a specified time period the coupling of the output of the phase detector to the input of the low pass filter relative to the commencement of the first division cycle.

15. A phase-locked loop comprising:
   a phase detector receiving a reference signal and a feedback signal;
   a low pass filter;
   a voltage controlled oscillator having an input coupled to an output of the low pass filter; and
   a feedback divider coupled to an output of the voltage controlled oscillator, wherein the feedback divider receives a reset signal and a division value and is configured to, after the reset signal is disabled, divide the output of the voltage controlled oscillator by the division value to provide the feedback signal to the phase detector,
   wherein, during a first division cycle of the feedback divider, the division value is set to a predetermined nominal division value of the feedback divider multiplied by a ratio between a phase difference of the phase detector under a locked state of the phase-locked loop and 360°, and
   wherein, during a second division cycle subsequent to the first division cycle, the division value is set to the predetermined nominal division value.

16. The phase-locked loop as recited in claim 15, further comprising circuitry configured to synchronize a coupling of an output of the phase detector to an input of the low pass filter with a commencement of the first division cycle.

17. The phase-locked loop as recited in claim 15, wherein the phase-locked loop is a type-I phase-locked loop.

* * * * *